(12) United States Patent
Ikeda et al.

(10) Patent No.: US 7,321,517 B2
(45) Date of Patent: Jan. 22, 2008

(54) SEMICONDUCTOR MEMORY DEVICE

(75) Inventors: Hitoshi Ikeda, Kawasaki (JP); Kaoru Mori, Kawasaki (JP); Yoshiaki Okuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/260,200

(22) Filed: Oct. 28, 2005

(65) Prior Publication Data
US 2007/0002648 A1   Jan. 4, 2007

(30) Foreign Application Priority Data
Jun. 29, 2005   (JP)   ............................ 2005-190298

(51) Int. Cl.
*G11C 7/00*   (2006.01)
(52) U.S. Cl. ...................... 365/194; 365/201; 365/203; 365/230.03; 365/230.06
(58) Field of Classification Search ................ 365/194, 365/201, 203, 230.03, 230.06
See application file for complete search history.

(56) References Cited

U.S. PATENT DOCUMENTS 5,365,482 A * 11/1994 Nakayama .................. 356/201
6,341,089 B1   1/2002 Sawada et al.
6,343,038 B1   1/2002 Makino et al.
6,925,022 B2 *  8/2005 Arimoto et al. ............. 365/222
2004/0165452 A1 *  8/2004 Nakano ...................... 365/193

FOREIGN PATENT DOCUMENTS

JP   2001-76498   3/2001
JP   2002-15598   1/2002

* cited by examiner

Primary Examiner—Hoai V. Ho
(74) Attorney, Agent, or Firm—Arent Fox LLP

(57) ABSTRACT

An equalizing circuit connects a pair of bit lines to each other in response to the activation of an equalizing control signal and connects the pair of bit lines to a precharge voltage line. An equalizing control circuit deactivates the equalizing control signal in response to the activation of a first timing signal. A word line driving circuit activates one of word lines in response to the activation of a second timing signal. A first signal generating circuit of a timing control circuit generates the first timing signal. A second signal generating circuit of the timing control circuit activates the second timing signal after the deactivation of the equalizing control signal accompanying the activation of the first timing signal. A delay control circuit of the second signal generating circuit delays an activation timing of the second timing signal in a test mode from that in a normal mode.

13 Claims, 8 Drawing Sheets

SEMICONDUCTOR MEMORY DEVICE

CROSS REFERENCE TO RELATED APPLICATION

This application is based upon and claims the benefit of priority from Japanese Patent Application No. 2005-190298, filed on Jun. 29, 2005, the entire contents of which are incorporated herein by reference.

BACKGROUND OF THE INVENTION

1. Field of the Invention

The present invention relates to a semiconductor memory device, and more particularly, to a testing technique for detecting a bit line leak in a semiconductor memory device.

2. Description of the Related Art

In a semiconductor memory device such as a DRAM (Dynamic Static Random Access Memory), if a bit line leak occurs due to, for example, a short-circuit between a bit line and a word line, erroneous data is sometimes read through a read operation as described below. While the semiconductor memory device is in a standby state, an equalizing control signal to an equalizing circuit is activated. The equalizing control circuit connects a pair of bit lines to each other and connects the pair of bit lines to a precharge voltage line. Therefore, a voltage of the pair of bit lines is set to a bit line precharge level. Further, while the semiconductor memory device is in a standby state, a word line control signal to a word line driving circuit is inactivated. The word line driving circuit activates one of a plurality of word lines. Therefore, all the word lines are inactivated at a ground voltage.

When the semiconductor memory device shifts to an active state from the standby state, the equalizing control signal to the equalizing circuit is deactivated. This causes the pair of bit lines to be in a floating state. If, at this time, a short circuit is present, for example, between one of the pair of bit lines and the word line, the voltage of the one of the pair of bit lines drops from the bit line precharge level since all the word lines are set to the ground voltage. Thereafter, the word line control signal to the word line driving circuit is activated, so that a word line corresponding to a memory cell connected to the one of the pair of bit lines is activated to a word line high-level voltage. Consequently, if data "1" is stored in the memory cell connected to the one of the pair of bit lines, the voltage of the one of the pair of bit lines rises owing to electrical charges accumulated in the memory cell.

Then, when a sense amplifier control signal to a sense amplifier for amplifying a voltage difference between the pair of bit lines is activated, the voltage of the bit line connected to the selected memory cell and the voltage of the other one of the pair of bit lines are amplified to a bit line high-level voltage and the ground voltage respectively, and correct data is read by the read operation. If a short circuit between the bit line and the word line is present, the voltage of this bit line is lower than the bit line precharge level, and therefore, it does not become higher than the voltage of the other one of the pair of bit lines even when the data "1" is read from the memory cell. If the sense amplifier control signal is activated in this state, the voltage of the bit line connected to the selected memory cell and the voltage of the other one of the pair of bit lines are amplified to the ground voltage and the bit line high-level voltage respectively, and consequently, erroneous data is read by the read operation. Whether the correct data is read or the erroneous data is read by the read operation is determined by an amount of decrease in the voltage of the bit line when the word line is activated, and thus depends on the magnitude of a leak current of the bit line.

In a semiconductor memory device with a bit line leak, the bit line leak may cause a defect in a circuit after the shipment of the product due to, for example, a decrease in a short circuit resistance value between a bit line and a word line, and it may also cause an operation failure. Therefore, it is necessary to inspect the device on the presence or absence of the bit line leak in a test in manufacturing processes and invalidate a bit line having a leak by taking a measure such as relocating it in a redundant circuit.

Japanese Unexamined Patent Application Publication No. 2001-76498 discloses an technique of detecting a minute bit line leak in a semiconductor memory device having a plurality of blocks (memory cell arrays) and sense amplifiers each shared by two adjacent blocks, in such a manner that, in a test mode, all equalizing control signals are deactivated after a predetermined time passes from the input of a precharge command so as to increase the length of a period during which a pair of bit lines of a selected block are in a floating state, compared with that in a normal mode. Further, Japanese Unexamined Patent Application Publication No. 2002-15598 discloses an art of detecting a minute bit line leak in a semiconductor memory device by making longer a period from the activation of a word line driving circuit to the activation of a sense amplifier in a test mode than that in a normal mode.

In Japanese Unexamined Patent Application Publication No. 2001-76498, only the equalizing control signal corresponding to the selected block operates in the normal mode, but in the test mode, all the equalizing control signals operate. Since a boost voltage is often used as a high-level voltage of the equalizing control signal, in Japanese Unexamined Patent Application Publication No. 2001-76498, it is necessary to devise a special control operation such as increasing a current supply capacity of a power supply circuit or supplying a high voltage via an external terminal in the test mode. Further, in Japanese Unexamined Patent Application Publication No. 2001-76498, since current consumption in the test mode is several times as large as that in the normal mode, it is necessary to thicken an internal power supply line in order to prevent a drop of a power supply voltage due to a wiring resistance. Moreover, in Japanese Unexamined Patent Application Publication No. 2001-76498, it is necessary to add elements in a circuit for generating the equalizing control signal and route new signal lines in a word line driving circuit in order to realize the aforesaid test mode. These measures, if implemented, result in an increase in the chip size of the semiconductor memory device.

Further, in Japanese Unexamined Patent Application Publication No. 2001-76498, in the test mode, the equalizing control signals corresponding to blocks not selected are activated immediately before the word line driving circuit corresponding to the selected block is activated, unlike in the normal mode. Therefore, in the test mode, because of reasons such that the word line is not normally activated due to the voltage drop of the internal power supply line, there is a possibility that erroneous data is read by the read operation. This makes it difficult to decide whether or not the read of the erroneous data, if any, is ascribable to the bit line leak.

SUMMARY OF THE INVENTION

It is an object of the present invention to provide a semiconductor memory device capable of easily detecting a minute bit line leak without an increase in chip size.

According to one of the aspects of a semiconductor memory device of the present invention, a plurality of memory cells are provided at positions where a plurality of word lines and a pair of bit lines intersect with each other. An equalizing circuit connects the pair of bit lines to each other and connects the pair of bit lines to a precharge voltage line, in response to activation of an equalizing control signal. An equalizing control circuit deactivates the equalizing control signal in response to activation of a first timing signal. A word line driving circuit activates one of the word lines in response to activation of a second timing signal. A first signal generating circuit of a timing control circuit generates the first timing signal. A second signal generating circuit of the timing control circuit activates the second timing signal after the equalizing control signal is deactivated in response to the activation of the first timing signal. A delay control circuit of the second signal generating circuit delays an activation timing of the second timing signal in a test mode from an activation timing of the second timing signal in a normal mode.

In the semiconductor memory device as configured above, it is possible to increase in the test mode the length of a period from the release of the mutual connection of the pair of bit lines and the release of the connection of the pair of bit lines to the precharge voltage line up to the activation of the word line, compared with that in the normal mode. The period during which the pair of bit lines are in a floating state is elongated, so that when one of the pair of bit lines has a bit line leak, for example, it is possible to sufficiently drop a voltage of the bit line with the leak by the time when the word line corresponding to a memory cell connected to the bit line with the leak is activated. Consequently, erroneous data is read by a read operation, so that a minute bit line leak in the one of the pair of bit lines can be detected.

Further, the operations in the test mode are the same as those in the normal mode except that the activation timing of the second timing signal is delayed. Therefore, current consumption in the normal mode and current consumption in the test mode are substantially equal to each other. This results in eliminating necessity for taking measures such as increasing a current supply capacity of a power supply circuit, supplying a high voltage via an external terminal, thickening an internal power supply line, and the like in the test mode, which can prevent an increase in the chip size of the semiconductor memory device.

Further, since the same operations are performed in the test mode and in the normal mode except that the activation timing of the second timing signal is delayed, the operations unique to the test mode give little influence to the read operation. Therefore, it is easy to decide whether or not erroneous data read by the read operation in the test mode is ascribable to the bit line leak. Therefore, the bit line leak can be easily detected.

In a preferable example of the above-described aspect of the semiconductor memory device of the present invention, a first delay circuit of the delay control circuit outputs the first timing signal with a delay by a first duration of time. A second delay circuit of the delay control circuit outputs an output signal of the first delay circuit as the second timing signal in the normal mode, and outputs the output signal of the first delay circuit as the second timing signal with a delay by a second duration of time in the test mode. That is, the second signal generating circuit increases the length of a period from the activation of the first timing signal to the activation of the second timing signal by adding the second duration of time in the test mode. Therefore, it is possible to easily adjust the length of the period from the release of the mutual connection of the pair of bit lines and the release of the connection of the pair of bit lines to the precharge voltage line up to the activation of the word line.

In a preferable example of the aforesaid aspect of the semiconductor memory device of the present invention, a delay circuit of the delay control circuit outputs the first timing signal with a delay. A selecting circuit of the delay control circuit outputs an output signal of the delay circuit as the second timing signal in the normal mode, and outputs, as the second timing signal, an external control signal supplied via an external terminal in the test mode. Therefore, it is possible to adjust the activation timing of the second timing signal by the external control signal in the test mode. This is effective for a more minute bit line leak detection which requires a great increase of the length of the period from the release of the mutual connection of the pair of bit lines and the release of the connection of the pair of bit lines to the precharge voltage line up to the activation of the word line.

According to another aspect of a semiconductor memory device of the present invention, each of a first block and a second block has a plurality of memory cells provided at positions where a plurality of word lines and a pair of bit lines intersect with each other. A first equalizing circuit connects the pair of bit lines of the first block to each other and connects the pair of bit lines of the first block to a precharge voltage line, in response to activation of a first equalizing control signal. A second equalizing circuit connects the pair of bit lines of the second block to each other and connects the pair of bit lines of the second block to the precharge voltage line, in response to activation of a second equalizing control signal. An equalizing control circuit deactivates the first equalizing control signal in response to activation of a first timing signal, when the first block is selected, and deactivates the second equalizing control signal in response to activation of the first timing signal, when the second block is selected. A sense amplifier is provided in common to the first and second blocks and amplifies a voltage difference between the pair of bit lines of one of the first and second blocks. A first switch circuit connects the pair of bit lines of the first block to the sense amplifier in response to activation of a first switch control signal. A second switch circuit connects the pair of bit lines of the second block to the sense amplifier in response to activation of a second switch control signal. A switch control circuit deactivates the first switch control signal when the second block is selected and deactivates the second switch control signal when the first block is selected. A first word line driving circuit activates one of the word lines of the first block in response to activation of a second timing signal when the first block is selected. A second word line driving circuit activates one of the word lines of the second block in response to the activation of the second timing signal when the second block is selected. A first signal generating circuit of a timing control circuit generates the first timing signal. A second signal generating circuit of the timing control circuit activates the second timing signal after the first or second equalizing control signal is deactivated in response to the activation of the first timing signal. The switch control circuit deactivates the second switch control signal in response to the activation of the first timing signal, when the first block is selected in a normal mode, and deactivates the first switch control signal in response to the activation of the first timing signal, when the second block is selected in the normal mode. The switch control circuit deactivates the second switch control signal in response to the activation of the second timing signal, when the first block is selected in a test mode and deactivates the first switch control signal in response to the activation of the second timing signal, when the second block is selected in the test mode.

In the semiconductor memory device as configured above, when, for example, the first block is selected in the test mode, the pair of bit lines of the second block are kept connected to the sense amplifier (that is, the pair of bit lines of the first block) until immediately before the activation of the word line of the first block. Therefore, if one of the pair of bit lines of the second block has a bit line leak, for example, it is possible to drop the voltage of one of the pair of the bit lines of the first block during a period from the release of the mutual connection of the pair of bit lines of the first block and the release of the connection of the pair of bit lines to the precharge voltage line up to the activation of the word line corresponding to a memory cell connected to the one of the pair of bit lines of the first block. Consequently, erroneous data is read by the read operation, so that it is possible to detect the bit line leak in the one of the pair of bit lines of the second block.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, an embodiment of the present invention will be described, using the drawings. Note that each terminal and a signal supplied via the terminal are denoted by the same reference symbol. Each signal line and a signal supplied to the signal line are denoted by the same reference symbol. Each voltage line and a voltage supplied to the voltage line are denoted by the same reference symbol. Each signal whose signal name does not have "/" at its head is a signal with positive logic, and each signal whose signal name has "/" at its head is a signal with negative logic.

Figure 1:
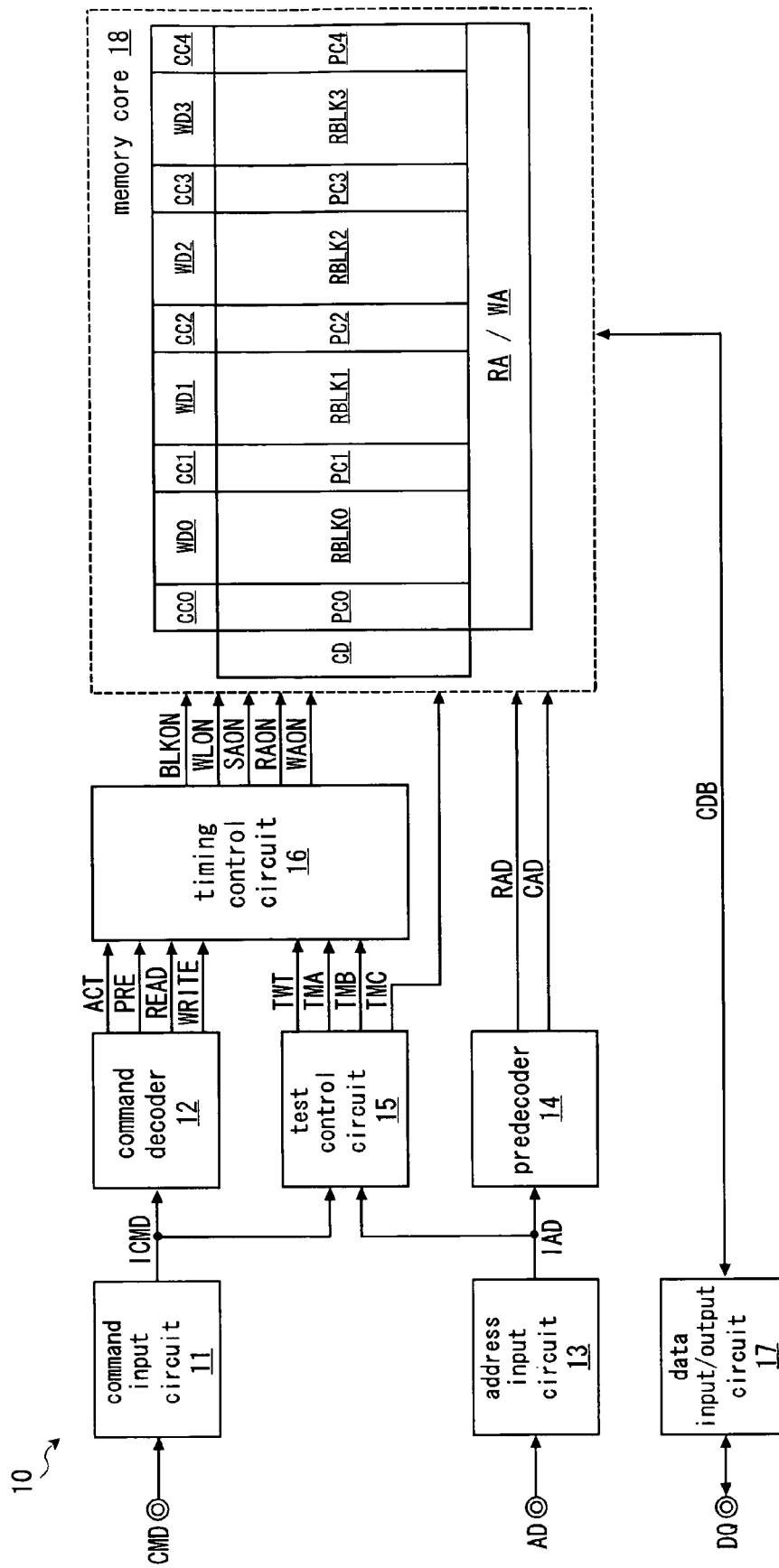
FIG. 1 is a block diagram showing an embodiment of a semiconductor memory device of the present invention.

FIG. 1 shows an embodiment of a semiconductor memory device of the present invention. A semiconductor memory device 10, which is formed as, for example, a DRAM, includes a command input circuit 11, a command decoder 12, an address input circuit 13, a predecoder 14, a test control circuit 15, a timing control circuit 16, a data input/output circuit 17, and a memory core 18. The command input circuit 11 receives a command signal CMD via a command input terminal CMD and outputs the received signal as an internal command signal ICMD.

The command signal CMD includes a clock signal CK, a chip enable signal /CE, an output enable signal /OE, a write enable signal /WE, an upper byte signal /UB, a lower byte signal /LB, and so on. The internal command signal ICMD includes an internal clock signal ICK, an internal chip enable signal ICE, an internal output enable signal 10E, an internal write enable signal IWE, an internal upper byte signal IUB, an internal lower byte signal ILB, and so on.

The command decoder 12 temporarily activates an active signal ACT when detecting an active command as a result of decoding the internal command signal ICMD. The command decoder 12 temporarily activates a precharge signal PRE when detecting a precharge command as a result of decoding the internal command signal ICMD. The command decoder 12 temporarily activates a read signal READ when detecting a read command as a result of decoding the internal command signal ICMD. The command decoder 12 temporarily activates a write signal WRITE when detecting a write command as a result of decoding the internal command signal ICMD.

The address input circuit 13 received an address signal AD of a plurality of bits via an address input terminal AD and outputs the received signal as an internal address signal IAD of a plurality of bits. The predecoder 14 receives the internal address signal IAD and activates one of a plurality of row decode signals RAD or one of a plurality of column decode signals CAD according to the received signal.

The test control circuit 15 generates a test word line timing signal TWT, a test mode signal TMA of a plurality of bits, and test mode signals TMB, TMC based on the internal command signal ICMD and the internal address signal IAD. The timing control circuit 16 generates a row block control signal BLKON, a word line control signal WLON, a sense amplifier control signal SAON, a read amplifier control signal RAON, and a write amplifier control signal WAON based on the active signal ACT, the precharge signal PRE, the read signal READ, the write signal WRITE, the test word line timing signal TWT, and the test mode signals TMA, TMB. Details of the test control circuit 15 and the timing control circuit 16 will be described in FIG. 3.

The data input/output circuit 17 receives read data from the memory core 18 via a common data bus CDB of a plurality of bits and outputs the received data to a data input/output terminal DQ. The data input/output circuit 17 receives via the data input/output terminal DQ write data that is to be sent to the memory core 18 and outputs the received data to the common data bus CDB. The memory core 18 includes a column decoder CD, row blocks RBLK0–RBLK3, word decoders WD0–WD3, control circuits CC0–CC4, peripheral circuits PC0–PC4, a read amplifier RA, and a write amplifier WA.

Figure 2:
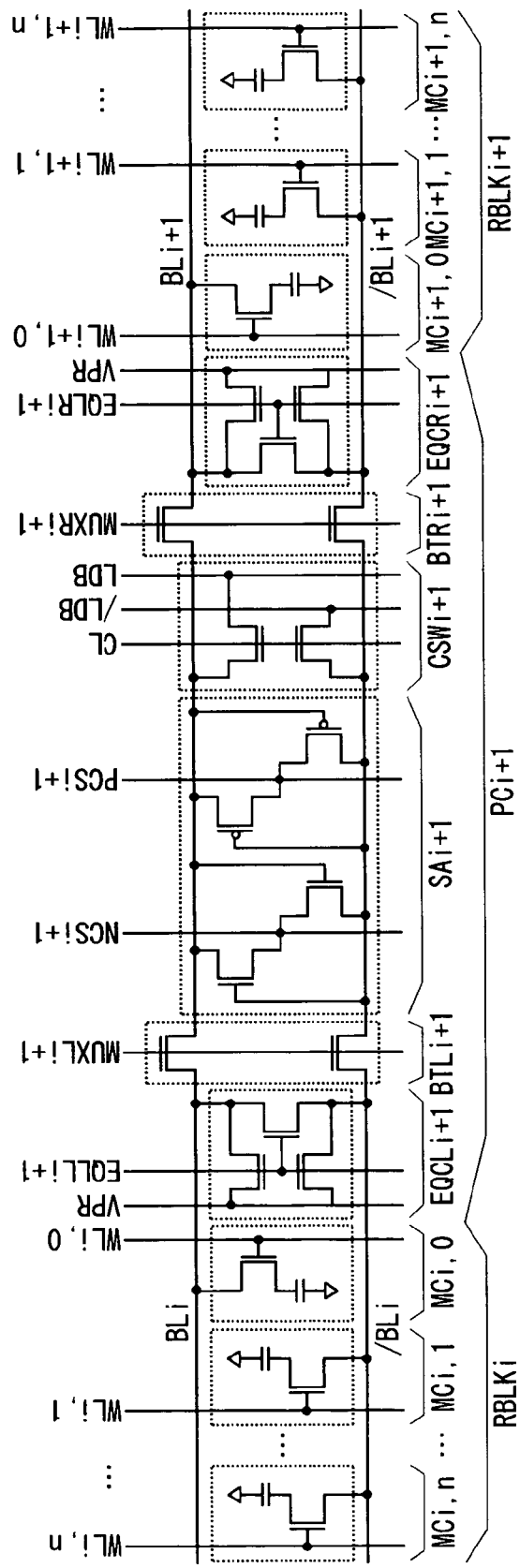
FIG. 2 is a circuit diagram showing one peripheral circuit in FIG. 1 and two row blocks adjacent across the peripheral circuit.

FIG. 2 shows one of the peripheral circuits in FIG. 1 and two row blocks adjacent across the peripheral circuit. A row block RBLKi (RBLKi+1) has a plurality of memory cells MCi, j (MCi+1, j)(j=0−n) arranged in matrix at positions where a plurality of word lines WLi, j (WLi+1, j) and a plurality of bit line pairs BLi, /BLi (BLi+1, /BLi+1) intersect with each other. The memory cells MCi, j (MCi+1, j) are dynamic memory cells, each being constituted of a transfer transistor (nMOS transistor) and a capacitor connected in series between the corresponding bit line BLi (BLi+1) or the bit line /BLi (/BLi+1) and a cell plate. A gate of the transfer transistor constituting the memory cell MCi, j (MCi+1, j) is connected to the corresponding word line WLi, j (WLi+1, j).

The word line WLi, j (WLi+1, j) is activated by the word decoder WDi (WDi+1) in response to the activation of the word line control signal WLON in an activation period of the row decode signal RAD corresponding to the word line WLi, j (WLi+1, j). The word line WLi, j (WLi+1, j) is deactivated by the word decoder WDi (WDi+1) in response to the deactivation of the word line control signal WLON. Note that a boost voltage is used as a high-level voltage of the word line WLi, j (WLi+1, j) in order to lower an on-state resistance of the transfer transistor constituting the memory cell MCi, j (MCi+1, j).

The peripheral circuit PCi+1 has a plurality of equalizing circuits EQCLi+1, a plurality of equalizing circuits EQCRi+1, a plurality of bit line transfer switches BTLi+1, a plurality of bit line transfer switches BTRi+1, a plurality of column switches CSWi+1, and a plurality of sense amplifiers SAi+1. The equalizing circuit EQCLi+1 (EQCRi+1) is constituted of two nMOS transistors for connecting the pair of bit lines BLi, /BLi (BLi+1, /BLi+1) to a precharge voltage line VPR, and one nMOS transistor for connecting the pair of bit lines BLi, /BLi (BLi+1, /BLi+1) to each other. Gates of the three transistors constituting the equalizing circuit EQCLi+1 (EQCRi+1) receive an equalizing control signal EQLLi+1 (EQLRi+1).

The equalizing control signal EQLLi+1 (EQLRi+1) is deactivated by the control circuit CCi+1 in response to the activation of the row block control signal BLKON in an activation period of one of the row decode signals RAD corresponding to the row block RBLKi (RBLKi+1). The equalizing control signal EQLLi+1 (EQLRi+1) is activated by the control circuit CCi+1 in response to the deactivation of the row block control signal BLKON. Note that a boost voltage is used as a high-level voltage of the equalizing control signal EQLLi+1 (EQLRi+1) in order to lower an on-state resistance of the nMOS transistors constituting the equalizing circuit EQCLi+1 (EQCRi+1).

The bit line transfer switch BTLi+1 (BTRi+1) is constituted of two nMOS transistors for connecting the pair of bit lines BLi, /BLi (BLi+1, /BLi+1) to the sense amplifier SAi+1 respectively. Gates of the two nMOS transistors constituting the bit line transfer switch BTLi+1 (BTRi+1) receive a switch control signal MUXLi+1 (MUXRi+1).

When the test mode signal TMC is inactivated, the switch control signal MUXLi+1 (MUXRi+1) is deactivated by the control circuit CCi+1 in response to the activation of the row block control signal BLKON in the activation period of one of the row decode signals RAD corresponding to the row block RBLKi+1 (RBLKi). When the test mode signal TMC is activated, the switch control signal MUXLi+1 (MUXRi+1) is deactivated by the control circuit CCi+1 in response to the activation of the word line control signal WLON in the activation period of one of the row decode signals RAD corresponding to the row block RBLKi+1 (RBLKi). The switch control signal MUXLi+1 (MUXRi+1) is activated by the control circuit CCi+1 in response to the deactivation of the row block control signal BLKON. Note that a boost voltage is used as a high-level voltage of the switch control signal MUXLi+1 (MUXRi+1) in order to lower an on-state resistance of the nMOS transistors constituting the bit line transfer switch BTLi+1 (BTRi+1).

The column switch CSWi+1 is constituted of two nMOS transistors for connecting the bit line pair BLi, /BLi or the bit line pair BLi+1, /BLi+1 to local data buses LDB, /LDB. Gates of the two nMOS transistors constituting the column switch CSWi+1 receive a column selecting signal CL. The column selecting signal CL is activated by the column decoder CD according to the column decode signals CAD. The local data buses LDB, /LDB are connected to a global data bus (not shown) according to the row decode signals RAD.

The sense amplifier SAi+1 is constituted of a latch circuit whose power supply terminals are connected to sense amplifier enable signal lines PCSi+1, NCSi+1. The sense amplifier enable signal line PCSi+1 is connected to sources of two pMOS transistors constituting the latch circuit. The sense amplifier enable signal line NCSi+1 is connected to sources of two nMOS transistors constituting the latch circuit. The sense amplifier enable signal lines PCSi+1, NCSi+1 are activated to high level and low level respectively by the control circuit CCi+1 in response to the sense amplifier control signal SAON in the activation period of one of the row decode signals RAD corresponding to the row block RBLK or the row block RBLK+1. The read amplifier RA amplifies a signal amount of read data on the global data bus in response to the activation of the read amplifier control signal RAON to output the amplified signal amount to the common data bus CDB. The write amplifier WA amplifies a signal amount of write data on the common data bus CDB in response to the activation of the write amplifier control signal WAON to output the amplified signal amount to the global data bus.

Figure 3:
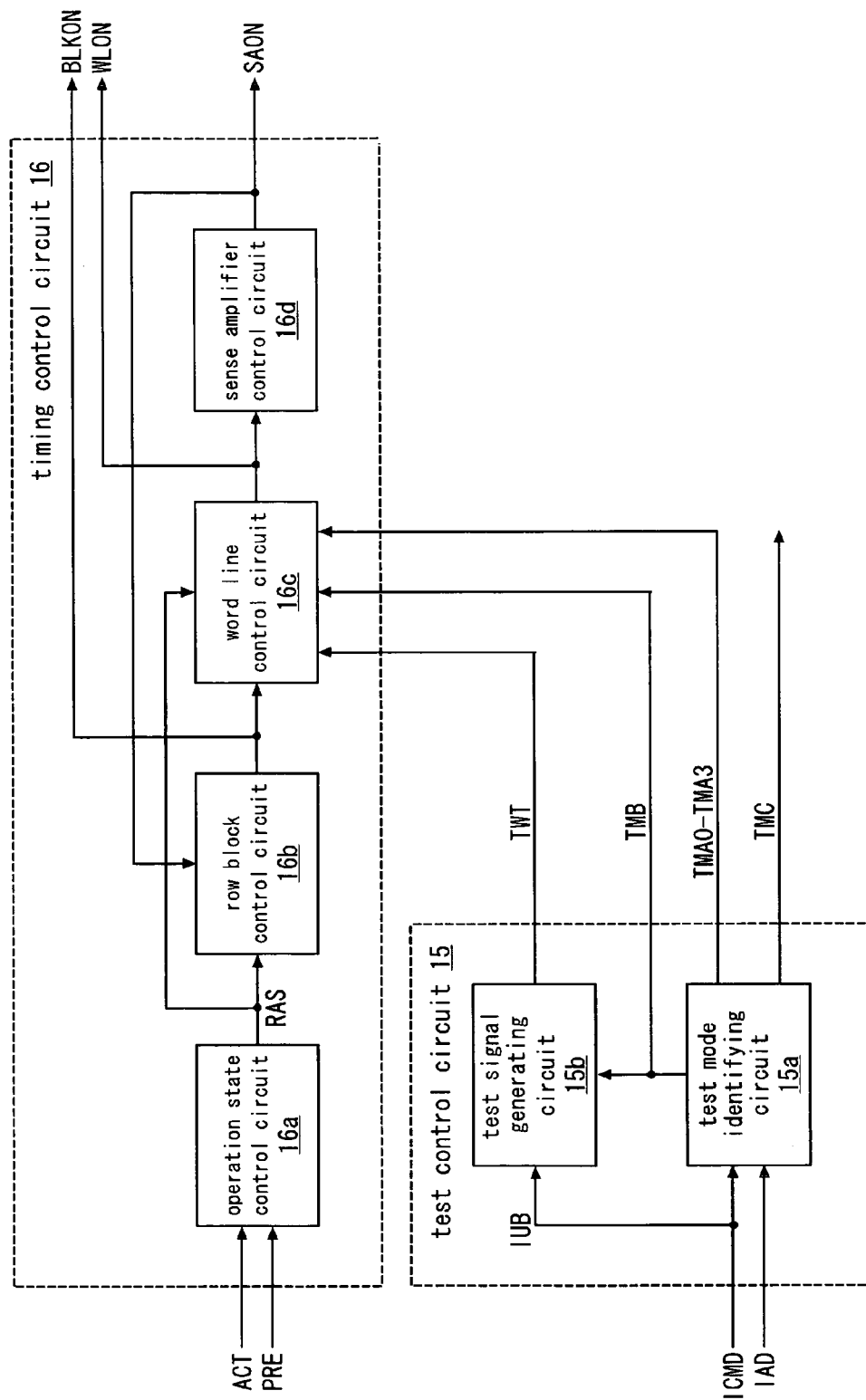
FIG. 3 is a block diagram showing a test control circuit and a timing control circuit shown in FIG. 1.
Figure 4:
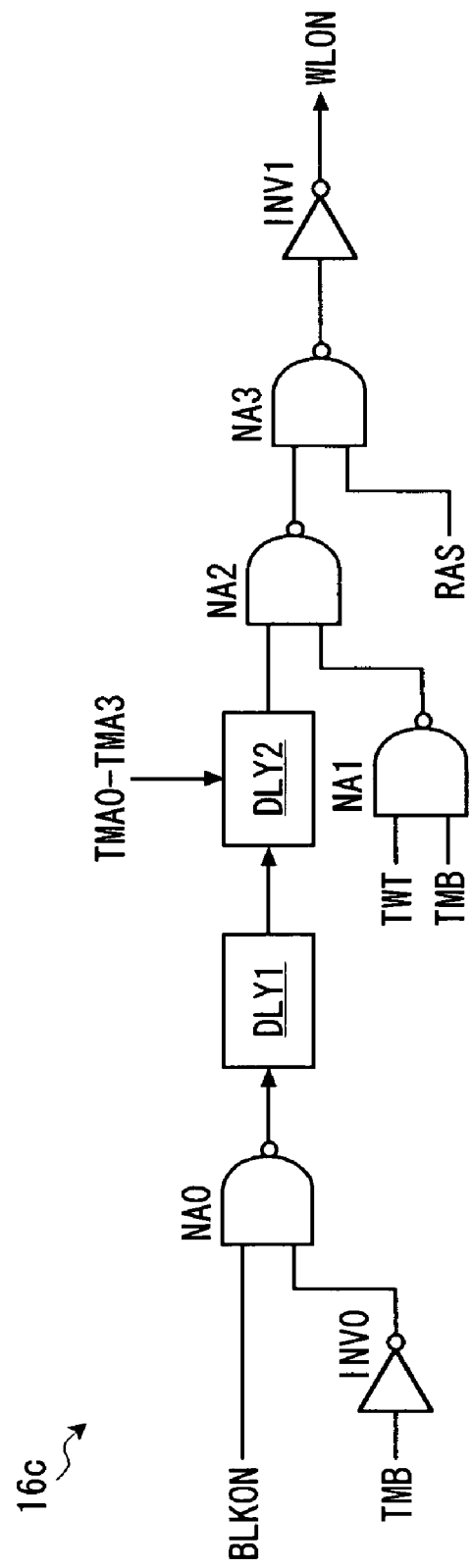
FIG. 4 is a circuit diagram showing a word line control circuit in FIG. 3.

FIG. 3 shows the test control circuit 15 and the timing control circuit 16 in FIG. 1. FIG. 4 shows a word line control circuit 16c in FIG. 3. In FIG. 3, the test control circuit 15 has a test mode identifying circuit 15a and a test signal generating circuit 15b. The test mode identifying circuit 15a activates at least one of the four-bit test mode signals TMA0 to TMA3 when detecting a first test mode entry command as a result of decoding the internal command signal ICMD and the internal address signal IAD. The test mode identifying circuit 15a activates the test mode signal TMB when detecting a second test mode entry command as a result of decoding the internal command signal ICMD and the internal address signal IAD. The test mode identifying circuit 15a activates the test mode signal TMC when detecting a third test mode entry command as a result of decoding the internal command signal ICMD and the internal address signal IAD. The test mode identifying circuit 15a deactivates an activated signal out of the test mode signals TMA0 to TMA3, TMB, and TMC when detecting a test mode exit command as a result of decoding the internal command signal ICMD and the internal address signal IAD.

The test signal generating circuit 15b outputs a low-level signal as the test word line timing signal TWT in a deactivation period of the test mode signal TMB. The test signal generating circuit 15b activates the test word line timing signal TWT in response to the activation of the internal upper byte signal IUB in an activation period of the test mode signal TMB. The test signal generating circuit 15b deactivates the test word line timing signal TWT in response to the deactivation of the internal upper byte signal ICB in the activation period of the test mode signal TMB.

The timing control circuit 16 has an operation state control circuit 16a, a row block control circuit 16b, the word line control circuit 16c, and a sense amplifier control circuit 16d. The operation state control circuit 16a activates a row address strobe signal RAS in response to the activation of the active signal ACT. The operation state control circuit 16a deactivates the row address strobe signal RAS in response the activation of the precharge signal PRE. The row block control circuit 16b activates the row block control signal BLKON in response to the activation of the row address strobe signal RAS. The row block control circuit 16*b* deactivates the row block control signal BLKON in response to the deactivation of the sense amplifier control signal SAON.

The word line control circuit 16*c* has inverters INV0, INV1, NAND gates NA0–NA3, and delay circuits DLY1, DLY2, as shown in FIG. 4. The inverter INV0 inverts the test mode signal TMB to output the inverted signal. The NAND gate NA0 inverts the row block control signal BLKON to output the inverted signal when the output signal of the inverter INV0 is high. The NAND gate NA0 outputs a high-level signal when the output signal of the inverter INV0 is low. The delay circuit DLY1 outputs an output signal of the NAND gate NA0, delaying its output timing by a predetermined time period. The delay circuit DLY2 outputs the output signal of the delay circuit DLY1 at a timing delayed by a time period corresponding to the test mode signal TMA [3:0]. Concretely, when the test mode signal TMA [3:0] indicates a decimal number "a" (a=0–15), the delay circuit DLY 2 outputs the output signal of the delay circuit DLY1 at a timing delayed by a time period "a" times as long as a unit time. Therefore, when the test mode signal TMA [3:0] indicates a decimal number "0", in other words, during a deactivation period of the test mode signals TMA0–TMA3, the delay circuit DLY2 outputs the output signal of the delay circuit DLY1 without any delay.

The NAND gate NA1 inverts the test word line timing signal TWT to output the inverted signal when the test mode signal TMB is high. The NAND gate NA1 outputs a high-level signal when the test mode signal TMB is low. The NAND gate NA2 inverts the output signal of the delay circuit DLY2 to output the inverted signal when the output signal of the NAND gate NA1 is high. The NAND gate NA2 outputs a high-level signal when the output signal of the NAND gate NA1 is low. The NAND gate NA3 inverts the output signal of the NAND gate NA2 to output the inverted signal when the row address strobe signal RAS is high. The NAND gate NA3 outputs a high-level signal when the row address strobe signal RAS is low. The inverter INV1 inverts the output signal of the NAND gate NA3 to output the inverted signal as the word line control signal WLON.

With such a configuration, in the deactivation period of the test mode signals TMA0–TMA3 and the test mode signal TMB, the word line control circuit 16*c* activates the word line control signal WLON after the delay time of the delay circuit DLY1 passes from the activation of the row block control signal BLKON. In the activation period of at least one of the test mode signals TMA0–TMA3, the word line control circuit 16*c* activates the word line control signal WLON after the time corresponding to the sum of the delay time of the delay circuit DLY1 and the delay time of the delay circuit DLY2 passes from the activation of the row block control signal BLKON. In the activation period of the test mode signal TMB, the word line control circuit 16*c* activates the word line control signal WLON in response to the activation of the test word line timing signal TWT. The word line control circuit 16*c* deactivates the word line control signal WLON in response to the deactivation of the row address strobe signal RAS, irrespective of the test mode signals TMA0–TMA3 and the test mode signal TMB.

In FIG. 3, the sense amplifier control circuit 16*d* activates the sense amplifier control signal SAON after a predetermined time passes from the activation of the word line control signal WLON. The sense amplifier control circuit 16*d* deactivates the sense amplifier control signal SAON after a predetermined time passes from the deactivation of the word line control signal WLON. Incidentally, the timing control circuit 16 also has a read amplifier control circuit and a write amplifier control circuit, though not shown in the drawing. The read amplifier control circuit temporarily activates the read amplifier control signal RAON in response to the activation of the read signal READ. The write amplifier control circuit temporarily activates the write amplifier control signal WAON in response to the activation of the write signal WRITE.

Figure 5:
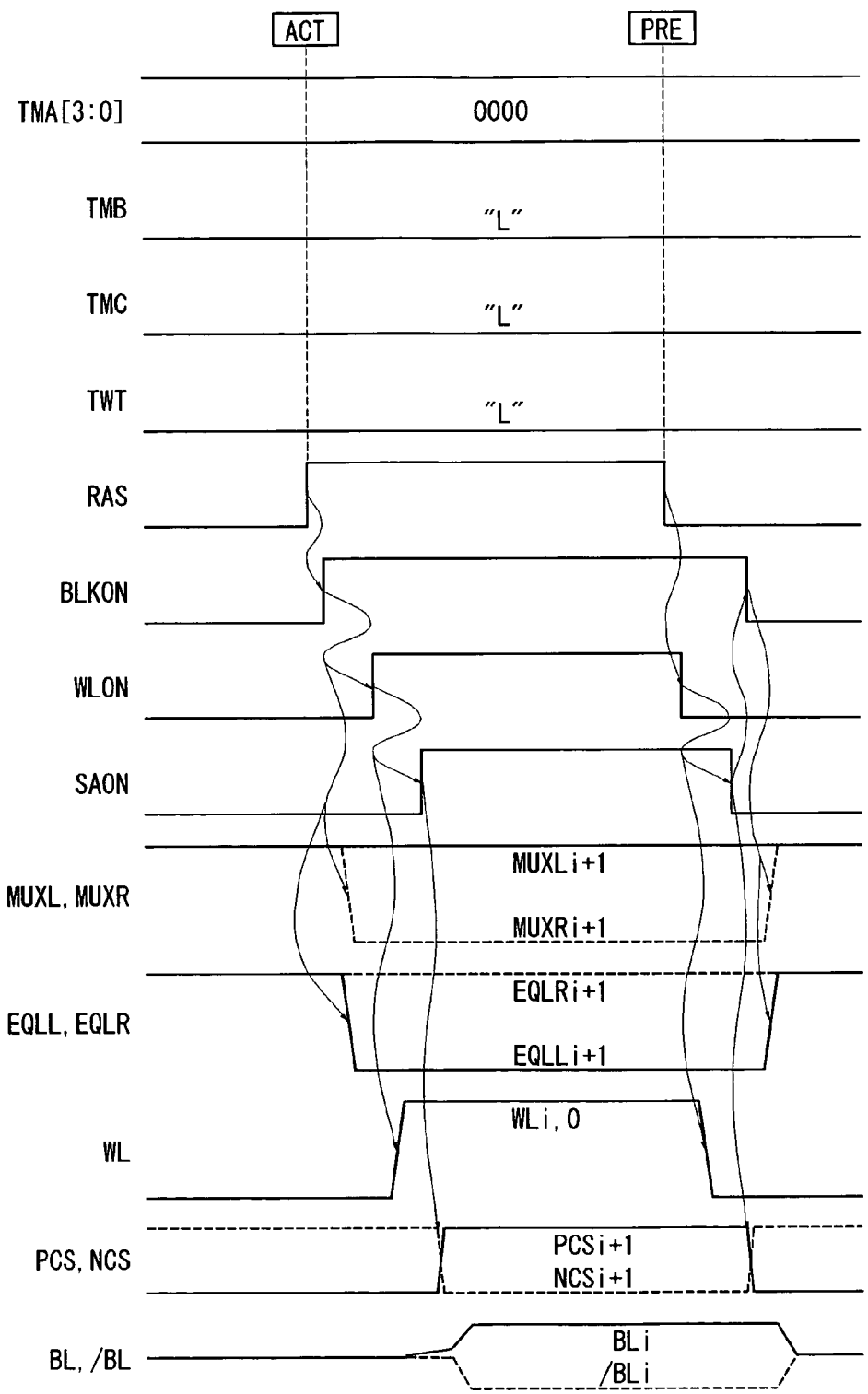
FIG. 5 is a timing chart showing operations in a normal mode.

FIG. 5 shows operations in the normal mode. A case where the row block RBLKi is selected as an access destination will be described as an example. In the normal mode, the test mode signals TMA0–TMA3 are inactivated at low level. That is, the test mode signal TMA [3:0] indicates "0000". The test mode signals TMB, TMC are also inactivated at low level. Since the test mode signal TMB is inactivated, the test word line timing signal TWT is also inactivated.

When the active command ACT is inputted in this state, the row address strobe signal RAS is activated to high level. In response to the activation of the row address strobe signal RAS, the row block control signal BLKON is activated to high level. In response to the activation of the row block control signal BLKON, the switch control signal MUXRi+1 is deactivated to low level. Consequently, the bit line transfer switch BTRi+1 turns off to disconnect the pair of bit lines BLi+1, /BLi+1 from the sense amplifier SAi+1. Further, in response to the activation of the row block control signal BLKON, the equalizing control signal EQLLi+1 is deactivated to low level. Consequently, the equalizing circuit EQCLi+1 turns off to release the mutual connection of the pair of bit lines BLi, /BLi and the connection of the pair of bit lines BLi, /BLi to the precharge voltage line VPR.

Since the test mode signal TMA [3:0] indicates "0000" and the test mode signal TMB is inactivated at low level, the word line control signal WLON is activated to high level after the delay time of the delay circuit DLY1 passes from the activation of the row block control signal BLKON. In response to the activation of the word line control signal WLON, for example, the word line WLi,0 corresponding to the memory cell MCi,0 connected to, the bit line BLi is activated. Consequently, if the memory cell MCi,0 connected to the bit line BLi stores data "1", electrical charges accumulated in the memory cell MCi,0 raises a voltage of the bit line BLi from the precharge voltage VPR.

Then, after the predetermined time passes from the activation of the word line control signal WLON, the sense amplifier control signal SAON is activated to high level. In response to the activation of the sense amplifier control signal SAON, the sense amplifier enable signal line PCSi+1 is activated to high level and the sense amplifier enable signal line NCSi+1 is activated to low level. Consequently, the bit lines BLi, /BLi are set to the bit line high-level voltage and the ground voltage respectively. When the read command READ is inputted in this state, the read operation is executed.

Thereafter, when the precharge command PRE is inputted, the row address strobe signal RAS is deactivated to low level. In response to the deactivation of the row address strobe signal RAS, the word line control signal WLON is deactivated to low level. In response to the deactivation of the word line control signal WLON, the word line WLi,0 corresponding to the memory MCi,0 connected to the bit line BLi is deactivated. Then, the sense amplifier control signal SAON is deactivated to low level after the predetermined time passes from the deactivation of the row address strobe signal RAS.

In response to the deactivation of the sense amplifier control signal SAON, the sense amplifier enable signal line PCSi+1 is deactivated to low level and the sense amplifier enable signal line NCSi+1 is deactivated to high level. Further, in response to the deactivation of the sense amplifier control signal SAON, the row block control signal BLKON is deactivated to low level. In response to the deactivation of the row block control signal BLKON, the switch control signal MUXRi+1 is activated to high level. Consequently, the bit line transfer switch BTRi+1 turns on to connect the pair of bit lines BLi+1, /BLi+1 to the sense amplifier SAi+1. Further, in response to the deactivation of the row block control signal BLKON, the equalizing control signal EQLLi+1 is activated to high level. Consequently, the equalizing circuit EQCLi+1 turns on to resume the mutual connection of the pair of bit lines BLi, /BLi and the connection of the pair of bit lines BLi, /BLi to the precharge voltage line VPR.

Figure 6:
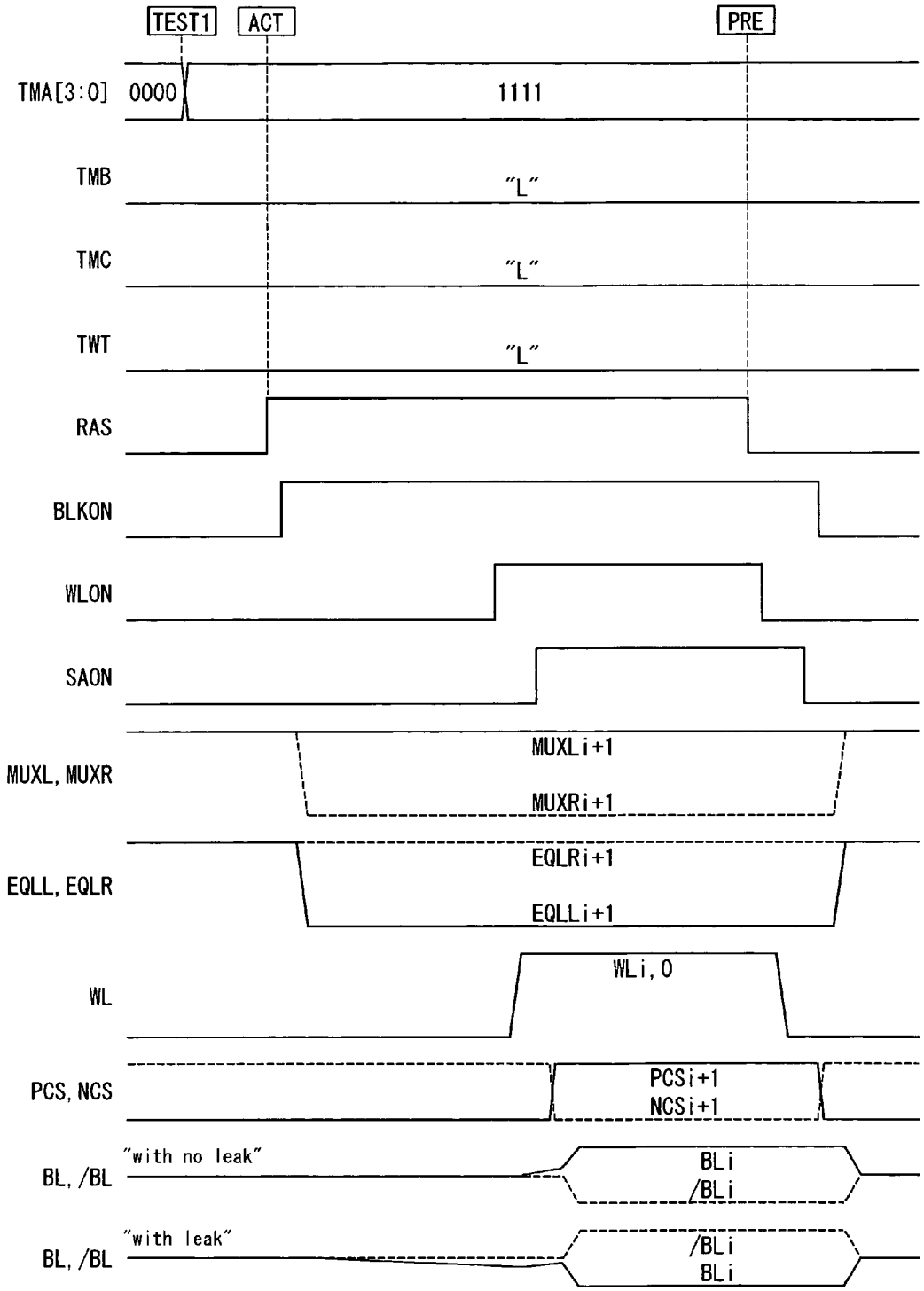
FIG. 6 is a timing chart showing operations in a first test mode.

FIG. 6 shows operations in a first test mode. When a first test mode entry command TEST1 is inputted, for example, the test mode signals TMA0–TMA3 are activated to high level. That is, the test mode signal TMA [3:0] is set to "1111". When the active command ACT is inputted in this state, the same operations as those in the normal mode follow except that the word line control signal WLON is activated to high level after the time corresponding to the sum of the delay time of the delay circuit DLY1 and the delay time of the delay circuit DLY2 passes from the activation of the row block control signal BLKON. Therefore, the period from the activation of the row block control signal BLKON to the activation of the word line control signal WLON becomes longer. This increases the length of the period during which the pair of bit lines BLi, /BLi of the row block RBLKi is in the floating state. As a result, if a bit line leak is present in the bit line BLi, the voltage of the bit line BLi sufficiently drops. Therefore, erroneous data is read by the read operation, so that the bit line leak of the bit line BLi is detected.

Figure 7:
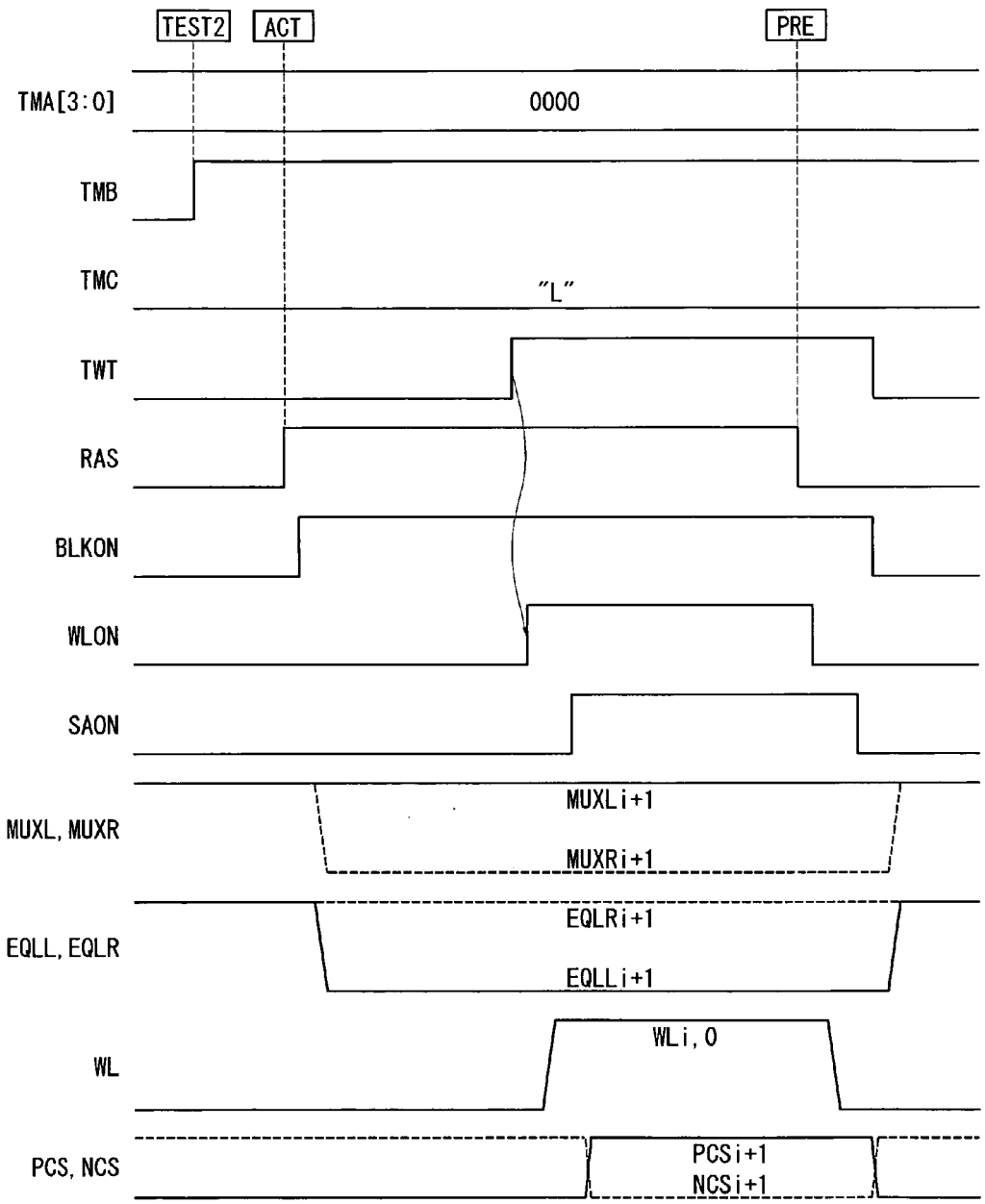
FIG. 7 is a timing chart showing operations in a second test mode.

FIG. 7 shows operations in a second test mode. When a second test mode entry command TEST2 is inputted, for example, the test mode signal TMB is activated to high level. When the active command ACT is inputted in this state, the same operations as those in the normal mode follow except that the word line control signal WLON is activated to high level in response to the activation of the test word line timing signal TWT. Therefore, delaying the activation timing of the test word line timing signal TWT by the upper byte signal /UB increases the length of the period from the activation of the row block control signal BLKON to the activation of the word line control signal WLON as in the first test mode. This increases the length of the period during which the pair of bit lines BLi, /BLi of the row block RBLKi is in the floating state. As a result, if a bit line leak is present in the bit line BLi, the voltage of the bit line BLi sufficiently drops. Therefore, erroneous data is read by the read operation, so that the bit line leak of the bit line BLi is detected.

Figure 8:
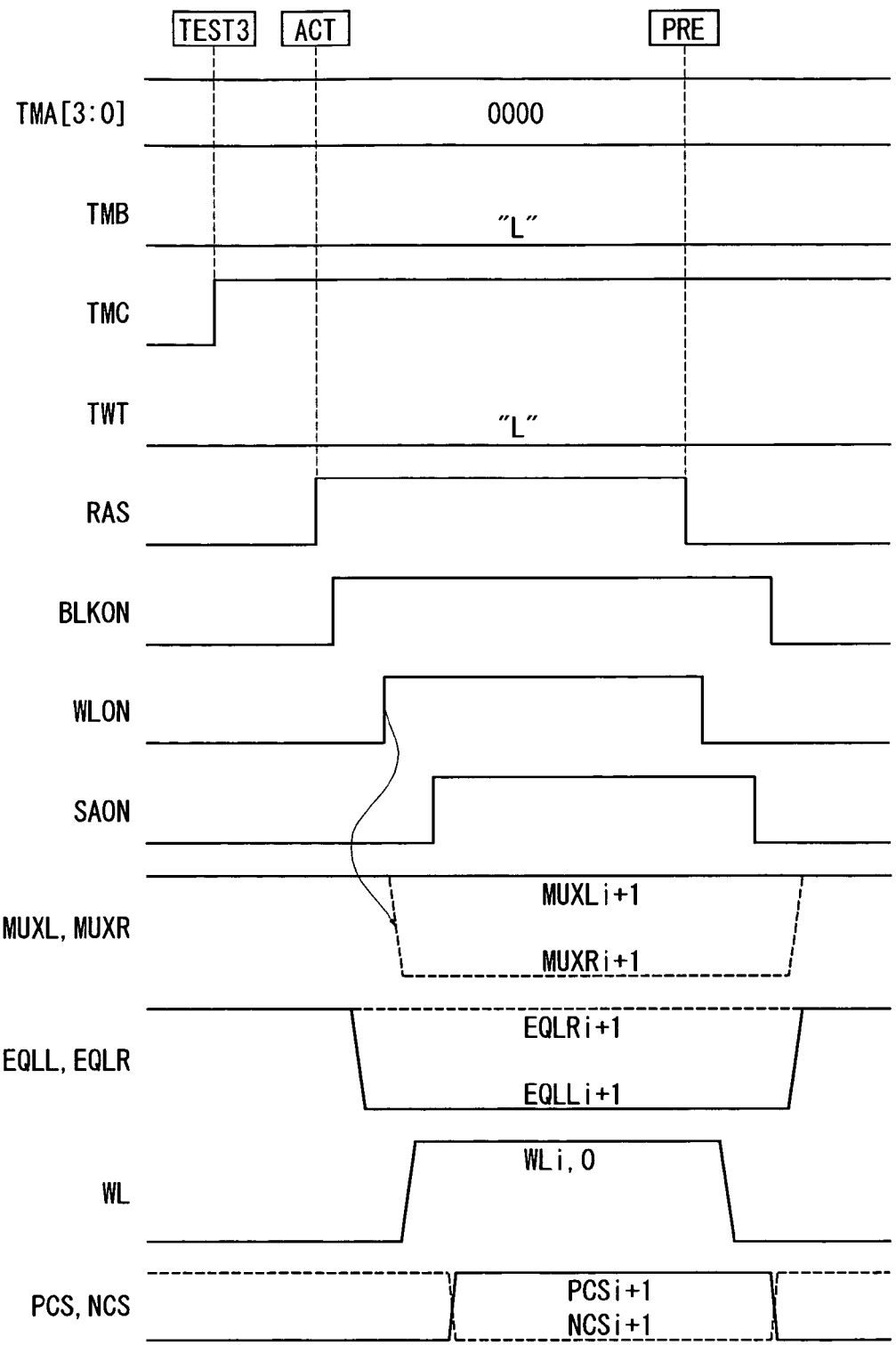
FIG. 8 is a timing chart showing operations in a third test mode.

FIG. 8 shows operations in a third test mode. When a third test mode entry command TEST3 is inputted, the test mode signal TMC is activated to high level. When the active command ACT is inputted in this state, the same operations as those in the normal mode follow except that the switch control signal MUXRi+1 is deactivated to low level in response to the activation of the word line control signal WLON. Therefore, the bit line BLi+1 of the row block RBLKi+1 is kept connected to the sense amplifier SAi+1 (that is, the bit line BLi) until immediately before the activation of the word line WLi,0 corresponding to the memory cell MCi,0 connected to the bit line BLi of the row block RBLKi. As a result, if a bit line leak is present in the bit line BLi+1, the voltage of the bit line BLi drops during the period from the release of the mutual connection of the pair of bit lines BLi, /BLi and the release of the connection of the pair of bit lines BLi, /BLi to the precharge voltage line VPR up to the activation of the word line WLi,0 corresponding to the memory cell MCi,0 connected to the bit line BLi. Therefore, erroneous data is read by the read operation, so that the bit line leak of the bit line BLi+1 is detected.

In the embodiment as described above, in the first and second test modes, it is possible to increase the length of the period from the release of the mutual connection of the pair of bit lines BLi, /BLi of the row block RBLKi and the release of the connection of the pair of bit lines BLi, /BLi to the precharge voltage line VPR up to the activation of the word line WLi, j of the row block RBLKi, compared with that in the normal mode. If a bit line leak is present in, for example, the bit line BLi, it is possible to sufficiently drop the voltage of the bit line BLi by the activation instant of the word line WLi, j corresponding to the memory cell MCi, j connected to the bit line BLi, owing to the increased length of the period during which the pair of bit lines BLi, /BL is in the floating state. As a result, erroneous data is read by the read operation, so that a minute bit line leak of the bit line BLi can be detected.

Further, the operations in the first or second test mode are the same as the operations in the normal mode except that the activation timing of the word line control signal WLON is delayed. Therefore, current consumption in the normal mode and current consumption in the first or second test mode are substantially equal to each other. This, as a result, can eliminate needs for measures such as increasing a current supply capacity of a power supply circuit, supplying a high voltage via an external terminal, thickening an internal power supply line, or the like in the test mode. Moreover, there is no need to add elements in the control circuits CC0–CC4 and route new signal lines in the word decoders WD0–WD3 in order to realize the first and second test modes. Therefore, an increase in the chip size of the semiconductor memory device can be avoided.

Further, since the operations in the first or second test mode are the same as the operations in the normal mode except that the activation timing of the word line control signal WLON is delayed, the operations unique to the first or second test mode give little influence to the read operation. Therefore, if erroneous data is read by the read operation, it is easily discriminated whether or not this is ascribable to the bit line leak. Therefore, the bit line leak can be easily detected.

In the first test mode, the word line control circuit 16c increases the length of the period from the activation timing of the row block control signal BLKON to the activation timing of the word line control signal WLON by adding the delay time of the delay circuit DLY2. Therefore, it is possible to easily adjust the length of the period from the release of the mutual connection of the pair of bit lines BLi, /BLi and the release of the connection of the pair of bit lines BLi, /BLi to the precharge voltage line VPR up to the activation of the word line WLi, j in the row block RBLKi.

In the second test mode, the activation timing of the word line control signal WLON can be adjusted by the upper byte signal /UB. This is effective for a case where there is a need for greatly increasing the length of the period from the release of the mutual connection of the pair of bit lines BLi, /BLi and the release of the connection of the pair of bit lines BLi, /BLi to the precharge voltage line VPR up to the activation of the word line WLi, j in the row block RBLKi (for example, a case where a desired length of the period is several tens ns or more) in order to detect a more minute bit line leak.

In the third test mode, if, for example, the row block RBLKi is selected, the pair of bit lines BLi+1, /BLi+1 of the row block RBLKi+1 are kept connected to the sense amplifier SAi+1 (that is, the pair of bit lines BLi, /BLi) until immediately before the activation of the word line WLi, j of the row block RBLKi. Therefore, if a bit line leak is present in, for example, the bit line BLi+1, it is possible to drop the voltage of the bit line BLi during the period from the release of the mutual connection of the pair of bit lines BLi, /BLi and the release of the connection of the pair of bit lines BLi, /BLi to the precharge voltage VPR in the row block RBLKi up to the activation of the word line WLi, j corresponding to the memory cell MCi, j connected to the bit line BLi. Consequently, erroneous data is read by the read operation, so that the bit line leak of the bit line BLi+1 can be detected. Further, combining the third test mode with one of the first and second test modes makes it possible to detect even a minute bit line leak of the bit line BLi+1.

It should be noted that the present invention is not limited to the above embodiment, though the embodiment has described the example where the present invention is applied to the DRAM. The present invention may be applied to, for example, a pseudo SRAM having DRAM memory cells as well as having an interface of a SRAM (Static Random Access Memory).

The invention is not limited to the above embodiments and various modifications may be made without departing from the spirit and scope of the invention. Any improvement may be made in part or all of the components.

What is claimed is:

1. A semiconductor memory device comprising:
   a plurality of memory cells provided at positions where a plurality of word lines and a pair of bit lines intersect with each other;
   an equalizing circuit connecting said pair of bit lines to each other and connecting said pair of bit lines to a precharge voltage line, in response to activation of an equalizing control signal;
   an equalizing control circuit deactivating said equalizing control signal in response to activation of a first timing signal;
   a word line driving circuit activating one of said word lines in response to activation of a second timing signal; and
   a timing control circuit having a first signal generating circuit which generates said first timing signal and a second signal generating circuit which activates said second timing signal after said equalizing control signal is deactivated in response to activation of said first timing signal, wherein
   said second signal generating circuit includes a delay control circuit delaying an activation timing of said second timing signal in a test mode from an activation timing of said second timing signal in a normal mode.

2. The semiconductor memory device according to claim 1, wherein said delay control circuit comprises:
   a first delay circuit outputting said first timing signal with a delay by a first duration of time; and
   a second delay circuit outputting an output signal of said first delay circuit as said second timing signal in the normal mode, and outputting the output signal of said first delay circuit as said second timing signal with a delay by a second duration of time in the test mode.

3. The semiconductor memory device according to claim 1, wherein said delay control circuit comprises:
   a delay circuit outputting said first timing signal with a delay; and
   a selecting circuit outputting an output signal of said delay circuit as said second timing signal in the normal mode, and outputting an external control signal as said second timing signal in the test mode, the external control signal being supplied via an external terminal.

4. A semiconductor memory device comprising:
   a first block and a second block each having a plurality of memory cells provided at positions where a plurality of word lines and a pair of bit lines intersect with each other;
   a first equalizing circuit connecting the pair of bit lines of said first block to each other and connecting the pair of bit lines of said first block to a precharge voltage line, in response to activation of a first equalizing control signal; and
   a second equalizing circuit connecting the pair of bit lines of said second block to each other and connecting the pair of bit lines of said second block to said precharge voltage line, in response to activation of a second equalizing control signal;
   an equalizing control circuit deactivating said first equalizing control signal in response to activation of a first timing signal, when said first block is selected, and deactivating said second equalizing control signal in response to activation of said first timing signal, when said second block is selected;
   a sense amplifier provided in common to said first and second blocks and amplifying a voltage difference between the pair of bit lines of one of said first and second blocks;
   a first switch circuit connecting the pair of bit lines of said first block to said sense amplifier in response to activation of a first switch control signal;
   a second switch circuit connecting the pair of bit lines of said second block to said sense amplifier in response to activation of a second switch control signal;
   a switch control circuit deactivating said first switch control signal when said second block is selected and deactivating said second switch control signal when said first block is selected;
   a first word line driving circuit which activates one of the word lines of said first block in response to activation of a second timing signal, when said first block is selected;
   a second word line driving circuit which activates one of the word lines of said second block in response to the activation of said second timing signal, when said second block is selected; and
   a timing control circuit having a first signal generating circuit which generates said first timing signal and a second signal generating circuit which activates said second timing signal after said first or second equalizing control signal is deactivated in response to the activation of said first timing signal, wherein
   said switch control circuit deactivates said second switch control signal in response to the activation of said first timing signal, when said first block is selected in a normal mode, and deactivates said first switch control signal in response to the activation of said first timing signal, when said second block is selected in the normal mode, while deactivating said second switch control signal in response to the activation of said second timing signal, when said first block is selected in a test mode and deactivating said first switch control signal in response to the activation of said second timing signal, when said second block is selected in the test mode.

5. The semiconductor memory device according to claim 1, wherein said delay control circuit comprises:
a first delay circuit configured to output said first timing signal with a first delay by a first duration of time in a normal mode;
a second delay circuit configured to output said second timing signal with a second delay by a second duration of time in a test mode; and
a control circuit configured to deactivate said second delay circuit in the normal mode, and to activate said second delay circuit in the test mode.

6. A semiconductor device comprising:
a plurality of memory cells each of which is coupled to a word line and a bit line;
a first timing generating circuit configured to generate a first timing signal;
a second timing generating circuit configured to generate a second timing signal and include a first delay circuit and a second delay circuit;
an equalizing control circuit coupled to receive the first timing signal and generate an equalizing signal;
an equalizing circuit coupled to receive the equalizing signal to connect the bit line with a precharge voltage line; and
a word line driving circuit configured to activate the word line in response to the second timing signal,
wherein the second timing generating circuit generates the second timing signal through the first delay circuit in a first mode, and generates the second timing signal through the first delay circuit and the second delay circuit in a second mode.

7. The semiconductor memory device according to claim 6, wherein the first timing generating circuit is a row block control circuit which generates a row block control signal for activating a row block as the first timing signal.

8. The semiconductor memory device according to claim 6, wherein a delay value of the second delay circuit is changed based on a control signal.

9. The semiconductor memory device according to claim 6, wherein the second mode is a test mode and the second delay circuit is controlled based on a test mode signal.

10. The semiconductor memory device according to claim 6 further comprising:
a sense amplifier control circuit configured to generate a sense amplifier control signal for amplifying a voltage difference between a pair of the bit lines based on the second timing signal.

11. A semiconductor device comprising:
a plurality of memory cells each of which is coupled to a word line and a bit line;
a row block control circuit configured to generate a row block control signal to activate a row block based on a row address strobe signal;
a word line control circuit configured to generate a word line control signal based on the row block control signal;
a word line driving circuit to activate the word line in response to the word line control signal,
wherein the word line control circuit includes a first delay circuit and a second delay circuit, the first delay circuit delays the row block control signal, and the second delay circuit delays the delayed row block control signal based on a mode signal and outputs the word line control signal.

12. The semiconductor memory device according to claim 11 further comprising:
an equalizing circuit configured to connect the bit line with a precharge voltage line in response to an equalizing signal which is generated based on the row block control signal.

13. The semiconductor memory device according to claim 11 further comprising:
a sense amplifier control circuit configured to generate a sense amplifier control signal and supply the sense amplifier control signal to the row block control circuit.

* * * * *